(12) United States Patent
Chou et al.

(10) Patent No.: US 7,456,115 B2
(45) Date of Patent: Nov. 25, 2008

(54) METHOD FOR FORMING SEMICONDUCTOR DEVICES HAVING REDUCED GATE EDGE LEAKAGE CURRENT

(75) Inventors: Anthony I-Chih Chou, Beacon, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 11/160,700

(22) Filed: Jul. 6, 2005

(65) Prior Publication Data
US 2007/0010050 A1    Jan. 11, 2007

(51) Int. Cl.
*H01L 21/31* (2006.01)

(52) U.S. Cl. .................. 438/775; 438/265; 438/197; 438/302
(58) Field of Classification Search ................ 438/775, 438/256
See application file for complete search history.

(56) References Cited

U.S. PATENT DOCUMENTS

| | | | |
|---|---|---|---|
| 5,650,344 A | | 7/1997 | Ito et al. |
| 6,518,636 B2 * | | 2/2003 | Segawa et al. ............... 257/411 |
| 7,268,050 B2 * | | 9/2007 | Jeong .......................... 438/305 |
| 2006/0134846 A1 * | | 6/2006 | Wang .......................... 438/211 |
| 2007/0218605 A1 * | | 9/2007 | Ozawa et al. ................ 438/164 |

* cited by examiner

*Primary Examiner*—Dung A. Le
(74) *Attorney, Agent, or Firm*—Joseph P. Abate; Mark Bilak

(57) ABSTRACT

The present invention provides methods for forming semiconductor FET devices having reduced gate edge leakage current by using plasma or thermal nitridation and low-temperature plasma re-oxidation processes post gate etch.

19 Claims, 5 Drawing Sheets

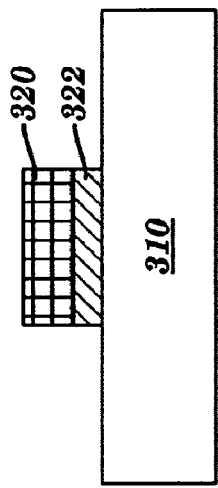
FIG. 3D
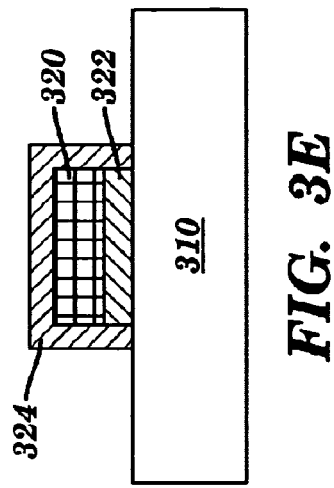
FIG. 3E
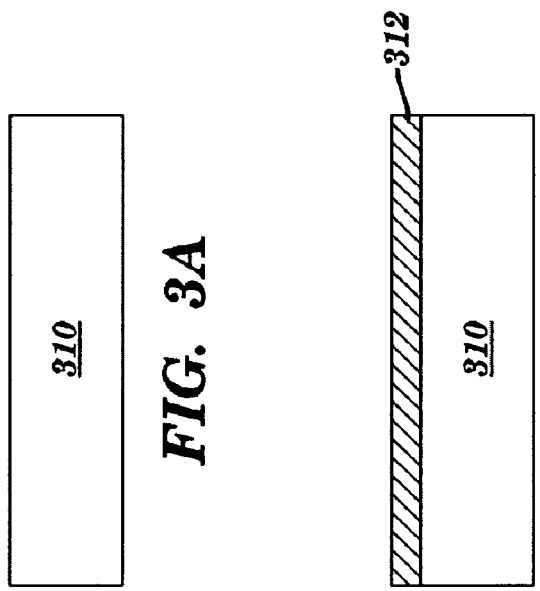
FIG. 3A
FIG. 3B
FIG. 3C
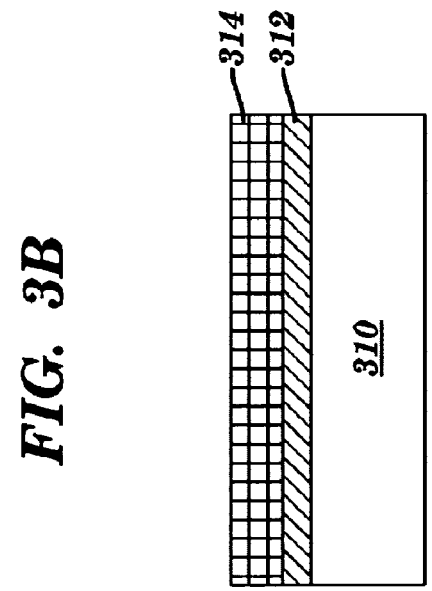

US 7,456,115 B2

METHOD FOR FORMING SEMICONDUCTOR DEVICES HAVING REDUCED GATE EDGE LEAKAGE CURRENT

FIELD OF THE INVENTION

The present invention broadly relates to semiconductor processing, and more particularly, to improved semiconductor gate dielectric and Field Effect Transistor (FET) processing.

DESCRIPTION OF THE PRIOR ART

Transistor scaling is one of many conventional techniques for improving semiconductor circuit performance. Complimentary-Metal-Oxide-Semiconductor (CMOS) transistor scaling conventionally includes the reduction of polysilicon gate length and gate insulator thickness to smaller dimensions to increase transistor drive current. Reduction of polysilicon gate length is conventionally done in conjunction with FET gate dielectric thinning to improve short-channel effects by increasing gate control of the channel.

Thinner gate dielectrics typically cause higher gate leakage currents due to increased tunneling, which has the undesired effect of increasing power dissipation in CMOS integrated circuits. Tunneling is a current leakage mechanism whereby leakage current tunnels from the gate conductor of the FET, through the gate insulator, to the body and/or diffusion regions of the FET device. Gate leakage current can also tunnel in the opposite direction, that is, from the body and/or diffusion regions of the FET device, through the gate insulator, to the gate conductor. Gate leakage current comprises two components, an area and an edge component. Gate leakage current is determined by $I_{LKG}=(I_{channel} \cdot W_{gate}) + (2 \cdot I_{edge} \cdot W_{gate})$ where $I_{LKG}$ is the total gate leakage, $I_{channel} \times W_{gate}$ is the component of total gate leakage contributed from the channel region area of the FET device (where $W_{gate}$ is the width of the FET device) and $I_{edge} \cdot W_{gate}$ is the component of total gate leakage contributed from the edge regions of the FET device. For FET devices having long gate lengths, the area component dominates the overall gate leakage, and the edge component is negligible. However, as gate length is reduced, the edge component contributes increasingly more, and can even dominate the total gate leakage current. This is especially true for p-FET devices (p-type FET devices), which have a high gate edge leakage current component.

FIG. 1 is a graph illustrating the gate edge leakage phenomenon found in FET devices where total gate leakage current ($I_{ginv}$) is plotted against gate length ($L_{poly}$) for both n-FET and p-FET device types. In this example, the n-FET device shows very little gate edge leakage because the total n-FET gate leakage current scales approximately linearly with gate length. The p-FET device exhibits a strong gate edge leakage component, especially at shorter gate lengths, as illustrated by the non-linear relationship between total gate leakage current and gate length. The total gate leakage current for the p-FET device is higher than predicted, especially at shorter gate lengths. The dashed line represents the predicted total p-FET leakage current with no edge gate leakage. The difference between the actual and predicted values is approximately equal to the gate edge leakage current component.

FIG. 2 illustrates a cross-sectional view of a conventional FET device. FET device 100 includes gate electrode 110, gate dielectric 120 and diffusion regions 130. Optional spacers 140 can be formed adjacent the gate dielectric and gate electrode as illustrated. FET device 100 is formed on substrate 150. $L_{poly}$ represents the length of gate conductor 110. FET device 100 is conventionally fabricated by first forming Shallow Trench Isolation (STI) and forming one or more well regions by implanting high energy dopants into substrate 150. A gate insulator layer is then grown on substrate 150. A conductor such as polysilicon is deposited on the insulator and subsequently patterned by photolithography and etched to form a gate stack, the gate stack being formed by gate electrode 110 and gate dielectric 120. The gate etch process is typically a Reactive Ion Etch (RIE) process which etches and stops on the gate insulator 120. During an overetch process to ensure that the gate electrode is completely etched away, edge regions of the gate dielectric 120 are exposed to the RIE, which can damage the gate dielectric and result in poor dielectric or device reliability at or near the edges of FET device 100. Such damage can be repaired by re-oxidation after the gate RIE process.

Damage caused to the gate dielectric region can be repaired by re-oxidation after the gate stack etch process. The industry standard re-oxidation process comprises a high-temperature thermal oxidation step in a furnace or single wafer reactor, performed using an oxidizing gas. For example, U.S. Pat. No. 5,650,344 (the '344 Patent) provides a Selectively re-Oxidized Nitrided gate Oxide (SONO) process for nitriding a gate oxide in a semiconductor device where the nitrogen region has a non-uniform nitrogen concentration. Specifically, the '344 Patent teaches a SONO process where an oxide film is nitrided in an ammonia ($NH_3$) ambient at a temperature of 900° to 1200° C. for 1 to 180 seconds. Because the overlying polysilicon gate shields the underlying gate oxide, the gate oxide is nitrided over the width of the gate oxide to a lesser and lesser extent as the center of the gate oxide is approached. The '344 Patent then provides that the nitrided film is re-oxidized in a dry oxygen ambient having a temperature of 900° to 1200° C. for 10 to 180 seconds to form a re-oxidized region. Because the overlying polysilicon gate shields the underlying gate oxide, the gate oxide is thermally re-oxidized to a lesser extent as the center of the gate oxide is approached. The high temperature nitridation and thermal re-oxidation processing steps described in the '344 Patent can lead to various problems such as n-FET (n-type FET device) polysilicon profile degradation, dopant loss (e.g. phosphorous dopant loss), and thermal-induced gate oxide defects. High temperature thermal re-oxidation should be avoided post gate etch to avoid the aforementioned problems. High temperature thermal re-oxidation has a doping-dependent oxidation rate. Thus, if the polysilicon gate is not uniformly doped at the time of re-oxidation, the oxide will grow to a different thickness along the vertical surface of the gate, resulting in a non-optimal polysilicon gate profile. Additionally, the high thermal budget for a high temperature re-oxidation process is known to degrade gate dielectric yield.

Reductions in both gate conductor length and gate dielectric thickness are needed to increase FET device performance, however, both techniques exasperate parasitic gate edge leakage currents. Thus, it is critical to minimize gate edge leakage current for FET devices, particularly p-FET devices, in order to further allow gate stack scaling. This is especially true for low power applications where gate edge leakage is a major component of power dissipation.

Therefore, there exists a need for forming FET devices that have reduced or suppressed the aforementioned problems.

BRIEF SUMMARY OF THE INVENTION

The present invention provides methods for forming FET devices that have reduced or suppressed the aforementioned problems, and FET devices and circuits formed in accordance therefrom.

In accordance with one aspect of the invention, a method of fabricating a gate dielectric comprises providing a semiconductor substrate, forming an insulating layer on the substrate, forming a conductive layer on the insulating layer, selectively removing the conductive layer and the insulating layer to form a gate electrode and a gate dielectric, exposing the gate dielectric to an oxygen containing plasma, and exposing the gate dielectric to nitrogen.

The gate dielectric can be exposed to the oxygen containing plasma and then exposed to the nitrogen. Alternatively, the gate dielectric can be exposed to the nitrogen and then exposed to the oxygen containing plasma.

The gate dielectric can be exposed to the nitrogen in accordance with either a thermal nitridation process or a plasma nitridation process.

In accordance with another aspect of the invention, an integrated circuit can be formed having a gate dielectric fabricated in accordance with one of the methods of the present invention.

In accordance with yet another aspect of the invention, a FET device can be formed having a gate dielectric fabricated in accordance with one of the methods of the present invention.

Further and still other aspects of the present invention will become more readily apparent when the following detailed description is taken in conjunction with the accompanying drawing figures.

BRIEF DESCRIPTION OF THE DRAWINGS

FIGS. 3A-3G are pictorial representations (through cross sectional views) illustrating the basic processing steps used in an embodiment of the present invention for fabricating a FET device having suppressed gate edge leakage current.

DETAILED DESCRIPTION OF PREFERRED EMBODIMENTS OF THE INVENTION

The present invention provides methods for forming FET devices that have reduced or suppressed the aforementioned problems by processing the gate stack of the FET devices in accordance with low temperature nitridation and plasma re-oxidation processes, and FET devices and circuits formed in accordance therewith.

Figure 1:
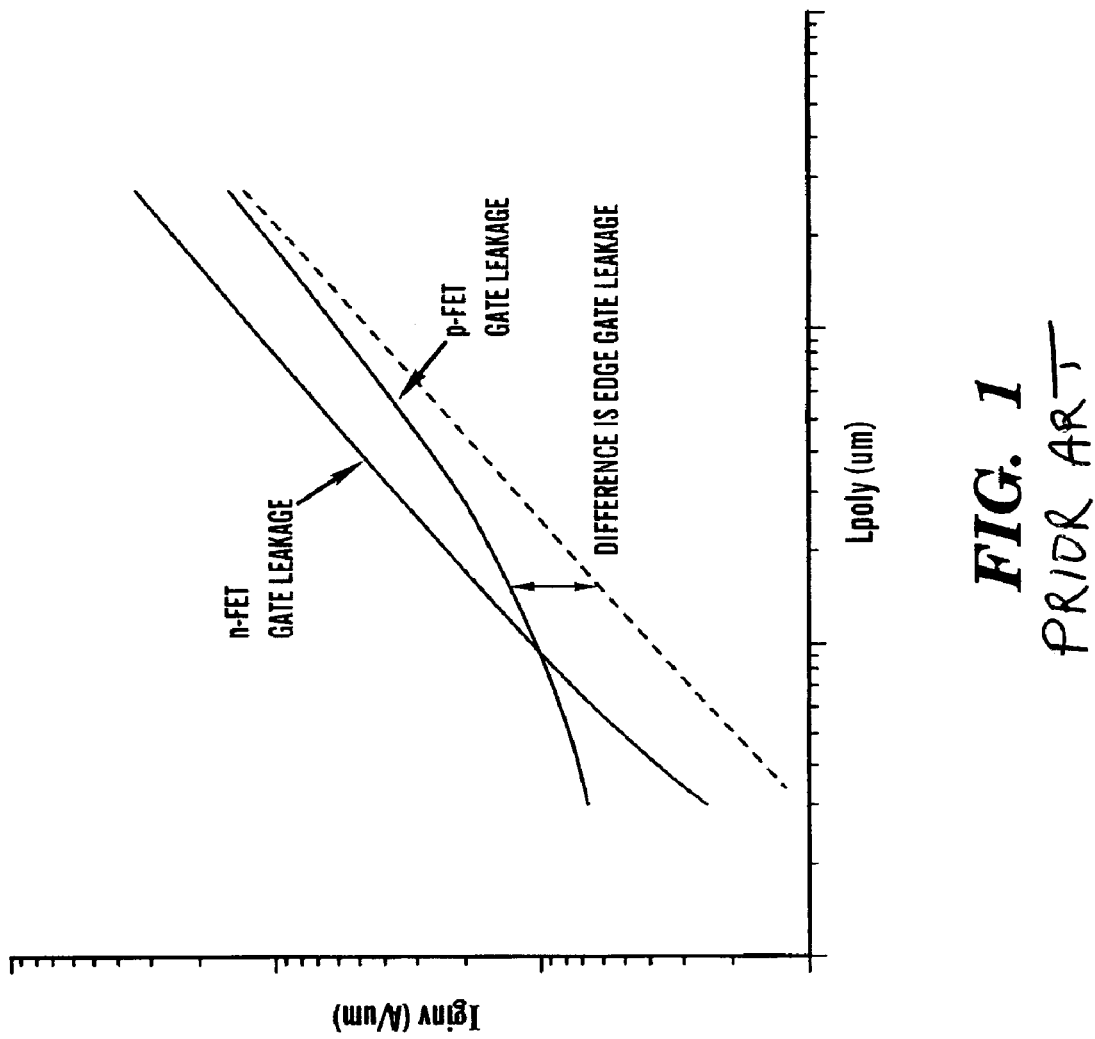
FIG. 1 is a plot illustrating the FET device gate edge gate leakage phenomenon.
Figure 2:
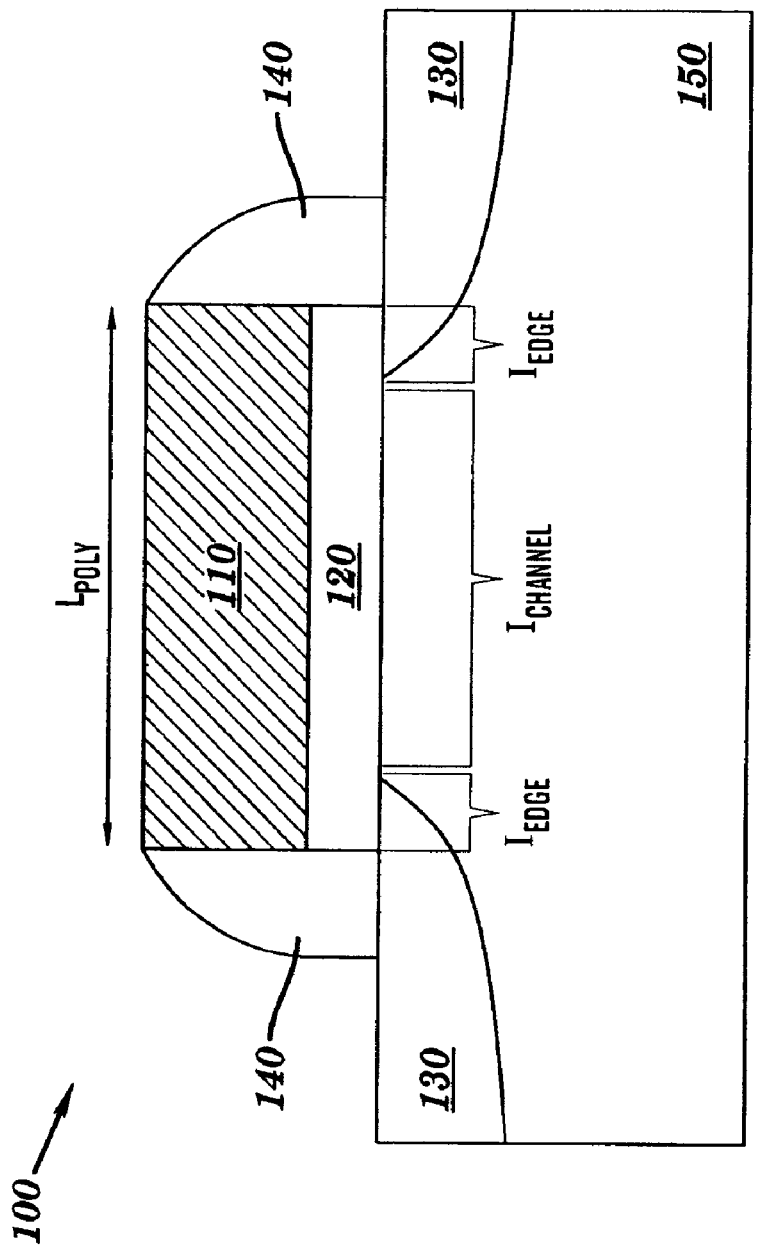
FIG. 2 is a pictorial representation (through a cross sectional view) illustrating a conventional FET device.
Figure 3F:
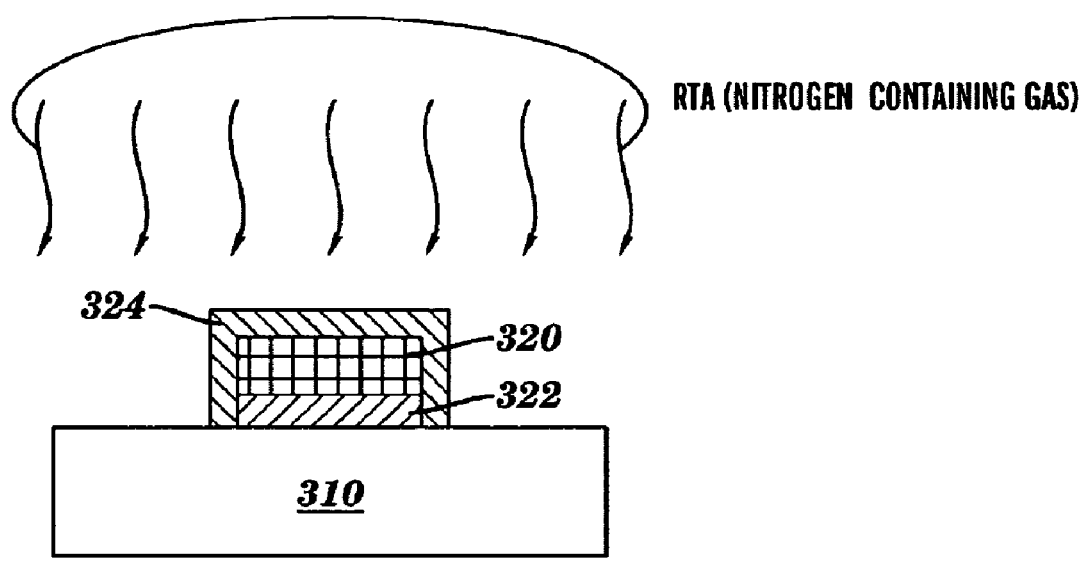

A method of carrying out the present invention is illustrated in FIGS. 3A-3G, which are cross-sectional views of a semiconductor device at various stages of the method. Semiconductor substrate 310 is provided for forming n-FET and/or p-FET type devices as shown in FIG. 3A. Substrate 310 can comprise any suitable semiconductor material such as silicon, bulk silicon, silicon-on-insulator ("SOI"), SiGe, Ge, GaAs, or the like.

With reference to FIG. 3B, an insulating layer 312 is formed on an upper surface of substrate 310. For example, insulating layer 312 can be deposited or grown on the substrate. Insulating layer 312 can comprise normal-k insulative materials ($3.0=<k<=7.0$) or high-k insulative materials ($k>7.0$). For illustrative purposes only, insulating layer 312 can comprise $SiO_2$, SiN, SiON, $HfO_2$, HfSiO, $ZrO_2$ or any suitable combination thereof.

With reference to FIG. 3C, a conductive layer 314 is formed on insulating layer 312. For example, conductive layer 314 can be deposited on the insulating layer. Optionally, conductive layer 314 can be doped with an appropriate dopant species (e.g. p-type dopant for p-FET devices and n-type dopant for n-FET devices). Conductive layer 314 can comprise any suitable material for forming a gate electrode of a FET device such as polysilicon, doped polysilicon, silicided polysilicon, SiGe, metals, high melting point refractory metals (e.g.; W, Ti, Ta, Mo, Nb, Re, Ru), binary or ternary metallic derivatives of high melting point refractory metals (e.g.; WN, TiN, TaN, MoN, $MoO2$, TaSiN) or the like.

With reference to FIG. 3D, selected regions of conductive layer 314 are masked using a photolithography process, and the exposed regions are subsequently removed down to the substrate 310 to form gate stacks comprising gate electrodes and gate dielectrics, such as gate electrode 320 and gate dielectric 322. The masking and etching of conductive layer 314 and underlying insulating layer 312 can be done using any suitable process, and would typically involve the deposition and developing of a suitable photoresist followed by an etch of the exposed regions of conductive layer 314 and underlying insulating layer 312. The photoresist can be developed using any suitable process such as optical lithography, electron beam lithography, x-ray lithography, or other conventional means for developing the photoresist. After the photoresist has been developed, the exposed regions of conductive layer 314 and underlying insulating layer 312 can then be removed, or etched, selective to the developed photoresist with a reactive ion etch (RIE), thus forming gate stacks (e.g. gate electrode 320 and gate dielectric 322). Gate dielectric 322 is typically damaged during the etch process, particularly at the edge regions of the dielectric. This damage should be repaired; otherwise, the FET to be subsequently formed from gate electrode 320 and gate dielectric 322 may not function properly, or it may fail prematurely.

With reference to FIG. 3E, the gate stack, and of particular importance, the damaged gate dielectric, is re-oxidized in accordance with a low-temperature plasma re-oxidation process. Oxide layer 324 is formed over the gate stack.

After low-temperature plasma re-oxidation of the gate stack, edge regions of the gate dielectric 322 have been repaired. The low-temperature plasma re-oxidation process is preferably performed at a low temperature between approximately 200° and 700° C., most preferably at a temperature of approximately 500° C. or less, to avoid problems such as polysilicon profile degradation, dopant loss, and thermal-induced gate oxide defects. The low-temperature plasma re-oxidation process is preferably performed at a pressure between approximately 10 mTorr and 100 Torr, and most preferably at a pressure between approximately 500 mTorr and 2 Torr. The low-temperature plasma re-oxidation process can use Oxygen alone or Oxygen in combination with nitrogen, argon, helium, or other inert gases. The thickness of oxide layer 324 is approximately 5 to 200 Å, depending on the specific application. The low-temperature plasma re-oxidation process is utilized in order to achieve an oxidation rate independent of doping to maintain a good gate profile (plasma oxidation) and to minimize the thermal budget (low temperature), thus improving gate oxide yield and reliability.

Unlike oxide layers formed in accordance with conventional high-temperature thermal oxidation processes, oxide layer 324 is conformal to the gate stack which improves the polysilicon gate profile. Additionally, oxide layer 324 has a uniform thickness independent from the doping profile of the gate electrode 320. Thus, unlike oxide layers formed in accordance with conventional high-temperature thermal oxidation processes, oxide layer 324 maintains a suitable polysilicon profile and does not induce polysilicon profile degradation. Furthermore, a low-temperature plasma re-oxidation process increases dopant retention in the gate electrode and improves gate dielectric yield and reliability by minimizing the thermal budget.

With reference to FIG. 3F, the substrate 310 is then subjected to either a nitrogen containing plasma or thermal nitridation process such as Rapid Thermal Annealing (RTA) in a nitrogen containing gas such as ammonia ($NH_3$) or nitric oxide (NO). Preferably, a thermal nitridation process is used. Thermal nitridation is preferably performed at a temperature between approximately 500° and 1100° C., most preferably at a temperature between approximately 800° and 1000° C. Thermal nitridation is preferably performed at a pressure between approximately 10 Torr and 760 Torr, most preferably at a pressure between approximately 400 Torr and 760 Torr. The thermal nitridation process can use $NH_3$ alone or $NH_3$ in combination with nitrogen, argon, or other inert gases. The percentage of nitrogen at the edge regions 328 of gate dielectric 322 after thermal nitridation can range from approximately 1 percent to 20 percent.

Figure 3G:
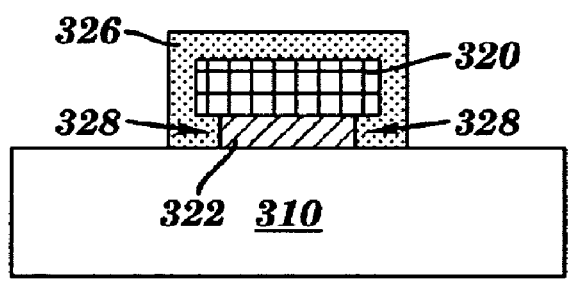

Unlike plasma nitridation, thermal nitridation facilitates the incorporation of a desired concentration of nitrogen atoms into the gate dielectric 322, particularly at the edge regions 328 of the gate dielectric as illustrated in FIG. 3G. Nitrogen is known to suppress gate leakage. As such, by incorporating a desired concentration of nitrogen atoms into the gate dielectric edge regions 328, gate edge leakage current can be significantly suppressed. In addition, by using thermal nitridation, a desired concentration of nitrogen atoms can be incorporated into the gate dielectric through the pre-existing oxide layer 324. Conventional plasma nitridation processes may not sufficiently facilitate the incorporation of a desired concentration of nitrogen atoms into the gate dielectric through a pre-existing oxide layer. RTA can be carried out in a single wafer, rapid thermal process chamber. Alternatively, the substrate can also be annealed in a batch processing tool such as a furnace. Plasma nitridation could be used in place of the thermal nitridation, but may be less effective at incorporating nitrogen into the edges of the gate oxide underneath the gate electrode for thick reoxidation layers 324. Plasma nitridation does have the advantage of being a lower temperature process than typical thermal nitridation process.

The scope of the present invention is not in any way limited to a particular processing order. Specifically, the gate dielectric can be re-oxidized with a low-temperature plasma re-oxidation process and then nitrided with either a plasma or thermal nitridation process as previously described and in accordance with FIGS. 3A-3G. Alternatively, the gate dielectric can be nitrided with either a plasma or thermal nitridation process and then re-oxidized with a low-temperature plasma re-oxidation process. The particular order of nitridation/re-oxidation of the gate stack does not affect the process parameter ranges as previously described in detail. As mentioned previously, plasma nitridation could be used in place of the thermal nitridation, but may be less effective at incorporating nitrogen.

FET device fabrication can then completed in accordance with any suitable process. For example, a series of source/drain extension, halo, and source/drain implants that are offset from the gate edge by various spacers can be performed to complete FET device fabrication. A short description of an exemplary process for completing FET device fabrication will now be given, however, those skilled in the art will recognize that other suitable processes could be used.

First, a thin oxide layer is formed on the gate stack sidewalls, most commonly known as an oxide spacer, and then the exposed portion of the substrate is doped with halo and/or source/drain extension implants. Formation of the source/drain regions may be accomplished using any suitable method for forming source/drain regions and that is tailored for specific performance requirements. There are many such methods for forming source/drain regions having various levels of complexity. Thus, in some embodiments of the present invention, using ion implantation for example, lightly doped source/drain regions and other source/drain regions can be formed. Thus, for n-FETs, typically P, As, or Sb for example is used for the source/drain implants in the range of 1 to 5 keV and a dose of $5\times10^{14}$ to $4\times10^{15}$ $cm^{-3}$. Similarly, for p-PFETs, typically B, In, or Ga for example is used for the source/drain implants in the range of 0.5 to 3 keV and dose of $5\times10^{14}$ to $4\times10^{15}$ $cm^{-3}$.

Optionally, source/drain extension and halo implants can be formed to reduce Short Channel Effects (SCE). For n-FETs, typically B, In, or Ga can be used for the halo implants with energies in the range of 5 to 15 keV and a dose of $1\times10^{13}$ to $8\times10^{13}$ $cm^{-3}$. Similarly, for p-FETs, P, As, or Sb can be used for the halos, with energies from 20 to 45 keV and dose of $1\times10^{13}$ to $8\times10^{13}$ $cm^{-3}$.

To complete the FET devices, electrical contacts to the sources, drains, and gate electrodes can then be formed. Accordingly, a dielectric may be deposited and planarized typically using a Chemical-Mechanical Polish (CMP) process. Contact holes can then be patterned and etched using an anisotropic process (e.g. RIE) or the like. The contact holes can be filled using any suitable conducting material, such as doped polysilicon, silicide (e.g. WSi), metals (e.g. Au, Al, Mo, W, Ta, Ti, Cu, or ITO (indium-tin oxide)), or the like. The conducting material can be deposited by evaporation, sputtering, or other known techniques, thereby forming source/drain and gate electrode contacts. Next, a first metal layer can be deposited and patterned using a RIE process or the like. Alternatively, the deposition and patterning of the first metal layer can be done following a damascene process flow.

Figure 4:
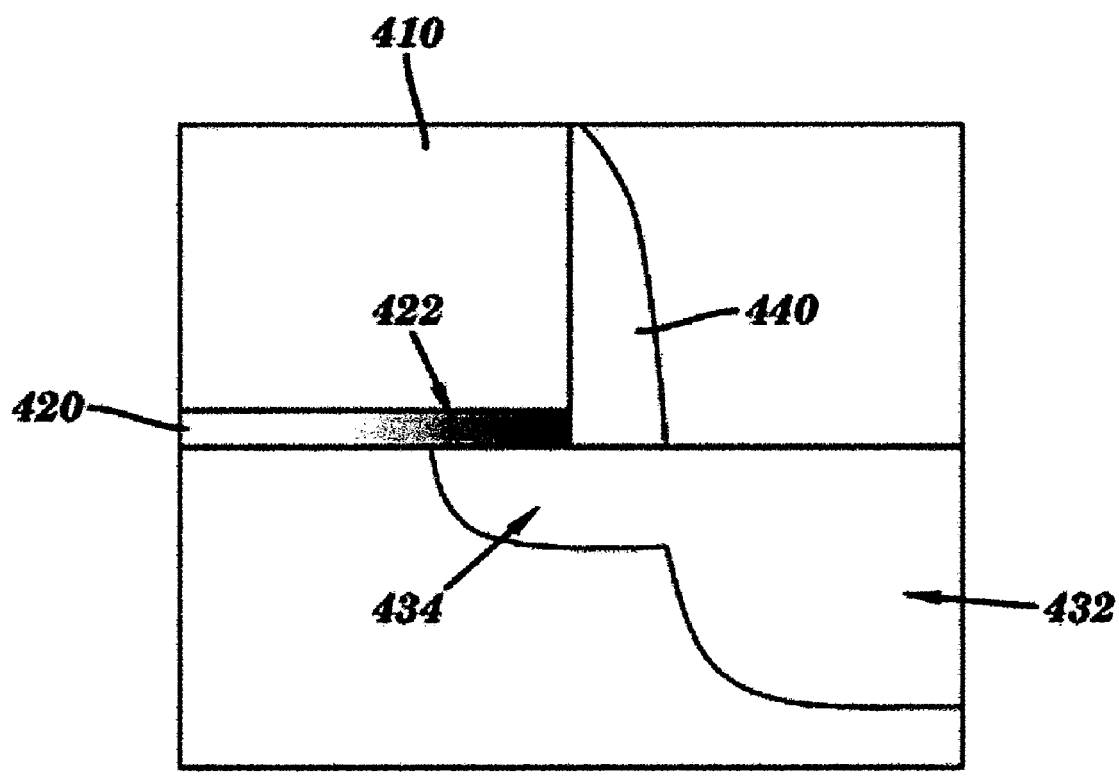
FIG. 4 is a pictorial representation (through a cross sectional view) illustrating an enlarged view of an edge region of an exemplary FET device fabricated in accordance an embodiment of the present invention.

FIG. 4 illustrates an enlarged cross-sectional view of an edge region of an exemplary FET device fabricated in accordance with an embodiment of the present invention. The source/drain diffusion regions of the device typically include a highly doped region 432 and a lightly doped extension region 434. Optional spacer 440 can be fabricated along the gate stack sidewalls. The nitrogen rich edge regions of the gate dielectric 420 formed by the nitridation process, such as edge region 422, effectively reduce edge gate leakage.

In accordance with the methods of the present invention, thermal nitridation after gate etching suppresses gate edge leakage current. Specifically, gate dielectric 420, which has been thermally nitrided and re-oxidized in accordance with the present invention, has edge regions such as edge region 422 that contain nitrogen atoms. Unlike nitrogen atoms incorporated into gate dielectrics by conventional plasma nitridation processes, nitrogen atoms incorporated into the gate dielectric 420 by thermal nitridation are present at both the upper surface and lower surface of the edge region 422. That is, nitrogen atoms are present at the interface of the gate edge region 422 and the gate electrode 410 (upper gate edge surface) and at the interface between the gate edge region 422 and the extension region 434 (lower gate edge surface). This nitrogen is effective at reducing the edge gate leakage current The concentration of nitrogen atoms in the gate dielectric 420 is greater toward the edges of the dielectric and becomes less and less toward the center of the dielectric. The depth of lateral penetration of the nitrogen atoms depends upon the process parameters as previously described. Preferably, the edge regions of the gate dielectric have a sufficient nitrogen concentration at both the upper and lower gate edge surfaces to suppress edge gate leakage. Preferably, the percentage of nitrogen atoms contained in the gate dielectric edge regions of the FET device ranges from approximately 1 percent to 20 percent. The percentage of nitrogen atoms contained in the gate dielectric edge regions depends on the particular application in which the FET device will be used.

FET devices having gate dielectrics fabricated in accordance with the present invention can be incorporated in various integrated circuit types, such as high performance logic, low power logic, Application-Specific Integrated Circuits (ASICs), Systems-On-Chip (SOCs), or memory devices, including high density multi-gigabit DRAMs and embedded DRAMs (e-DRAMs). Moreover, FET devices having gate dielectrics fabricated in accordance with the present invention can be readily combined with other components, for example, capacitors, resistors, inductors, diodes, memory cells, other FET devices, bipolar devices and so forth. For illustrative purposes only, FET devices having gate dielectrics fabricated in accordance with the present invention can be electrically coupled with other components, for example, capacitors, resistors, inductors, diodes, memory cells, other FET devices, bipolar devices and so forth, to form circuits such as filters, amplifiers, tuners, storage elements, phase-locked-loops, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of fabricating a gate dielectric, comprising:
providing a semiconductor substrate;
forming an insulating layer on the substrate;
forming a conductive layer on the insulating layer;
selectively removing the conductive layer and the insulating layer to form a gate electrode and a gate dielectric;
exposing edge regions of the gate dielectric to an oxygen containing plasma; and
incorporating nitrogen into the edge regions of the gate dielectrics, so that the nitrogen extends within the gate dielectric beyond a source/drain diffusion region disposed below the gate dielectric.

2. The method of claim 1, wherein the gate dielectric is exposed to the oxygen containing plasma before being exposed to the nitrogen.

3. The method of claim 1, wherein the temperature of the oxygen containing plasma is approximately 700° C. or less.

4. The method of claim 1, wherein the oxygen containing plasma is at a pressure between approximately 10 mTorr and 100 Torr.

5. The method of claim 1, wherein the gate dielectric is exposed to the nitrogen in accordance with a nitrogen containing gas at a temperature between approximately 500° C. and 1100° C.

6. The method of claim 1, wherein the gate dielectric is exposed to the nitrogen in accordance with a nitrogen containing gas at a pressure between approximately 10 Torr and 760 Torr.

7. The method of claim 1, wherein the edge regions of the gate dielectric contain approximately one percent to twenty percent nitrogen.

8. The method of claim 7, wherein upper and lower surfaces of the edge regions contain the nitrogen.

9. The method of claim 1, wherein the semiconductor substrate comprises a material selected from the group consisting of silicon, bulk silicon, silicon-on-insulator, SiGe, and Ge.

10. The method of claim 1, wherein the insulating layer comprises a material selected from the group consisting of normal-k insulative materials, high-k insulative materials, $SiO_2$, SiN, SiON, $HfO_2$, HfSiO, and $ZrO_2$.

11. The method of claim 1, wherein the conductive layer comprises a material selected from the group consisting of polysilicon, doped polysilicon, silicided polysilicon, SiGe, metals, high melting point refractory metals, binary metallic derivatives of high melting point refractory metals, ternary metallic derivatives of high melting point refractory metals, W, Ti, Ta, Mo, Nb, Re, Ru, WN, TiN, TaN, MoN, MoO2, and TaSiN.

12. The method of claim 1, wherein the oxygen containing plasma includes a gas selected from the group consisting of inert gases, nitrogen, helium, and argon.

13. The method of claim 1, wherein the gate dielectric is exposed to the nitrogen in accordance with a nitrogen containing plasma or a nitrogen containing gas.

14. The method of claim 1, further comprising:
forming source/drain regions in the substrate;
forming source/drain extension regions in the substrate; and
forming electrical contacts to the source/drain regions and the gate electrode.

15. An integrated circuit having a gate dielectric fabricated in accordance with the method of claim 1.

16. The integrated circuit of claim 15, wherein the integrated circuit comprises at least one integrated circuit type selected from the group consisting of high performance logic, low power logic, application-specific integrated circuits, systems-on-chip, memory devices, high density multi-gigabit DRAMs, and embedded DRAMs.

17. A FET device having a gate dielectric fabricated in accordance with the method of claim 1.

18. The FET device of claim 17, wherein the FET device is electrically coupled to at least one component to form a circuit.

19. The FET device of claim 18, wherein the component comprises at least one circuit element selected from the group consisting of capacitors, resistors, inductors, diodes, memory cells, FET devices, and bipolar devices.

* * * * *